(12) United States Patent
Duvvury et al.

(10) Patent No.: US 6,462,380 B1
(45) Date of Patent: Oct. 8, 2002

(54) ESD PROTECTION CIRCUIT FOR ADVANCED TECHNOLOGIES

(75) Inventors: Charvaka Duvvury, Plano, TX (US); Michael D. Chaine, Boise, ID (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/695,832

(22) Filed: Oct. 25, 2000

Related U.S. Application Data
(60) Provisional application No. 60/177,441, filed on Jan. 21, 2000.

(51) Int. Cl.[7] .............................................. H01L 23/62
(52) U.S. Cl. ................. 257/355; 257/356; 257/360; 257/361
(58) Field of Search .................... 361/56; 257/355, 257/356, 360, 361; 458/237; 438/237

(56) References Cited

U.S. PATENT DOCUMENTS

| | | | | |
|---|---|---|---|---|
| 4,939,616 A | | 7/1990 | Rountree ...................... 361/56 |
| 5,400,202 A | * | 3/1995 | Metz et al. .................... 361/56 |
| 5,640,299 A | * | 6/1997 | Leach .......................... 361/56 |
| 5,744,840 A | * | 4/1998 | Ng .............................. 527/360 |
| 5,844,280 A | * | 12/1998 | Kim ............................ 257/355 |
| 5,882,967 A | * | 3/1999 | Brown et al. ................ 458/237 |
| 5,945,713 A | * | 8/1999 | Voldman .................... 257/355 |
| 6,081,002 A | * | 6/2000 | Amerasekera et al. ...... 257/173 |
| 6,130,811 A | * | 10/2000 | Gans et al. ................... 361/56 |

* cited by examiner

*Primary Examiner*—Richard Elms
*Assistant Examiner*—Douglas Menz
(74) *Attorney, Agent, or Firm*—Robert W. Rountree; Wade James Brady, III; Frederick J. Telecky, Jr.

(57) ABSTRACT

A structure is designed with a lightly doped substrate (316) having a first conductivity type and a face. A first lightly doped region (314) has a second conductivity type and is formed within the lightly doped substrate. A first heavily doped region (308) has the first conductivity type and is formed at the face and extends to a first depth within the first lightly doped region. A second heavily doped region (312) has the second conductivity type and is formed at the face abutting the first heavily doped region. The second heavily doped region extends to a second depth and is at least partly within the first lightly doped region. A first isolation region (304) is formed at the face, abutting at least one of the first and second heavily doped regions. The first isolation region extends to a third depth that is greater than either of the first and the second depths.

21 Claims, 4 Drawing Sheets

ESD PROTECTION CIRCUIT FOR ADVANCED TECHNOLOGIES

This application claims priority under 35 USC §119(e)(1) of provisional application No. 60/177,441, filed Jan. 21, 2000.

FIELD OF THE INVENTION

This invention relates to an integrated circuit and more particularly to a protection circuit using shallow trench isolation technology.

BACKGROUND OF THE INVENTION

Present complementary metal oxide semiconductor (CMOS) and bipolar-CMOS (BiCMOS) circuits employ electrostatic discharge protection (ESD) circuits to protect against electrostatic discharge due to ordinary human and machine handling. This electrostatic discharge occurs when the semiconductor circuit contacts an object that is charged to a substantially different electrostatic potential of typically several thousand volts. The contact produces a short-duration, high-current transient in the semiconductor circuit. This high current transient may damage the semiconductor circuit through joule heating. Furthermore, high voltage developed across internal components of the semiconductor circuit may damage MOS transistor gate oxide.

Sensitivity of the semiconductor circuit is determined by various test methods. A typical circuit used to determine sensitivity of the semiconductor circuit to human handling includes a capacitor and resistor that emulate a human body resistor-capacitor (RC) time constant. The capacitor is preferably 100 pF, and the resistor is preferably 1500 Ω, thereby providing a 150-nanosecond time constant. A semiconductor device is connected to the test circuit at a predetermined external terminal for a selected test pin combination. In operation, the capacitor is initially charged to a predetermined stress voltage and discharged through the resistor and the semiconductor device. A post stress current-voltage measurement determines whether the semiconductor device is damaged. Although this test effectively emulates electrostatic discharge from a human body, it fails to comprehend other common forms of electrostatic discharge.

A charged-device ESD test is another common test method for testing semiconductor device sensitivity. This method is typically used to determine sensitivity of the semiconductor circuit to ESD under automated manufacturing conditions. The test circuit includes a stress voltage supply connected in series with a current limiting resistor. The semiconductor device forms a capacitor above a ground plane that is typically 1–2 pF. A low impedance conductor forms a discharge path having an RC time constant typically two orders of magnitude less than a human body model ESD tester. In operation, the semiconductor device is initially charged with respect to the ground plane to a predetermined stress voltage. The semiconductor device is then discharged at a selected terminal through the low impedance conductor. This connection produces a high-voltage, high-current discharge in which a magnitude of the initial voltage across the semiconductor device approaches that of the initial stress voltage.

A particular problem of design of silicon-controlled rectifier (SCR) input protection circuits arises with advanced shallow trench isolation (STI) processes. The problem will be explained in detail with reference to the section view (FIG. 1A) and the schematic diagram (FIG. 1B) of an SCR protection circuit of the prior art. The SCR includes a PNP bipolar transistor having an emitter 108 connected to an external terminal 100 via lead 118. The base region 114 of the PNP transistor is electrically connected to a heavily doped N+ region 106 by the parasitic resistance 115 of N-well region 114. The collector 130 of the PNP transistor is formed in the P-substrate 116. An NPN bipolar transistor has a collector 114 in common with the PNP base and a base 130 in common with the PNP collector. The NPN bipolar transistor has an emitter 124 connected to a Vss reference supply terminal 120. The protection circuit further includes a metal-oxide semiconductor (MOS) transistor having a drain 112, gate 122 and source 124. The drain 112 of the metal-oxide semiconductor (MOS) transistor 122 is connected to N+ region 106 through parasitic N-well resistors 115 and 111.

In operation, the SCR is activated by application of a positive electrostatic discharge pulse at the bond pad or external terminal 100 with respect to the Vss reference supply terminal 120. This positive pulse initially induces avalanche conduction of the MOS transistor due to a high electric field between the drain region 112 and the gate region 122. This avalanche conduction injects positive current directly into the base region 130 of the NPN transistor. This NPN transistor base current subsequently induces NPN transistor collector current through N-well resistor 114. This NPN transistor collector current forward biases the PNP transistor base and produces base current. The PNP transistor base current, therefore, initiates PNP transistor conduction and consequent regenerative SCR conduction as is well known in the art. A particular problem arises when highly doped regions such as N+ region 112 are physically surrounded by shallow trench isolation (STI) regions such as regions 102 and 104. These STI regions are typically greater than 1.0 micrometer deep and, therefore, serve to electrically decouple the transistors of the SCR having junction depths less than 0.3 micrometers. This decoupling increases the PNP transistor base resistance as well as the resistance between the MOS transistor and the SCR, thereby increasing the trigger or activation threshold of the SCR. The circuit of the prior art (FIG. 1A) attempted to resolve this problem by adding gate region 110. This gate region 110 provided a continuous active region of P+ doped region 108, N doped region 128 and N+ doped region 112 without an intervening STI region. Although this technique improved the decoupling problem, it introduced a thin oxide region between gate region 110 and N+ region 112 that was particularly susceptible to damage under high voltage ESD stress such as charged-device stress.

Referring now to FIG. 2A, there is a section view of another SCR protection circuit of the prior art as disclosed in U.S. Pat. No. 4,939,616, filed Nov. 13, 1989, and a corresponding schematic diagram (FIG. 2B). The SCR includes a PNP bipolar transistor having an emitter 208 connected to an external terminal 200. The base region 214 of the PNP transistor is electrically connected to a heavily doped N+ region 206 by the parasitic resistance 215 of N-well region 214.

The collector 230 of the PNP transistor is formed in the P-substrate 216. An NPN bipolar transistor has a collector 214 in common with the PNP base and a base 231 in common with the PNP collector. The NPN bipolar transistor has an emitter 224 connected to a Vss reference supply terminal 220. The protection circuit further includes a lateral parasitic NPN bipolar transistor having a collector 212, thick-oxide isolation region 230 and emitter 224. Other thick-oxide isolation regions are designated 233. A zener diode 209 couples P+ doped region 208 to N+ doped region 212.

In operation, the SCR is activated by application of a positive electrostatic discharge pulse at the bond pad or external terminal 200 with respect to the Vss reference supply terminal 220. This positive pulse initiates avalanche conduction at the reverse biased junction of N+ doped region 212 and P substrate 216. This avalanche conduction develops a voltage drop across N-well region 214 and forward biases zener diode 209. The zener diode conducts the avalanche current into the base 231 of the NPN transistor. The avalanche current in the base region 231 subsequently forward biases the NPN emitter 224, thereby initiating bipolar NPN conduction. This NPN conduction increases PNP transistor base current and, therefore, initiates PNP transistor conduction and consequent regenerative SCR conduction as is well known in the art. A particular problem arises with advanced technologies. The trigger or activation threshold of the SCR is primarily determined by the avalanche threshold of a junction formed by N+ region 212 and P-substrate 216. This high trigger or activation voltage may be incompatible with thin gate oxides and STI of advanced technologies. This increased trigger or activation threshold produces high voltage transients at the bond pad 200 and may cause premature failure of the internal circuit.

SUMMARY OF THE INVENTION

These problems are resolved by a structure with a lightly doped substrate having a first conductivity type and a face. A first lightly doped region has a second conductivity type and is formed within the lightly doped substrate. A first heavily doped region has the first conductivity type and is formed at the face and extends to a first depth within the first lightly doped region. A second heavily doped region has the second conductivity type and is formed at the face abutting the first heavily doped region. The second heavily doped region extends to a second depth and is at least partly within the first lightly doped region. A first isolation region is formed at the face, abutting at least one of the first and second heavily doped regions. The first isolation region extends to a third depth that is greater than either of the first and the second depths.

The present invention eliminates premature gate oxide degradation in a protection circuit due to high voltage ESD stress. Effective coupling of transistors is maintained for advanced processes such as STI.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 3A:
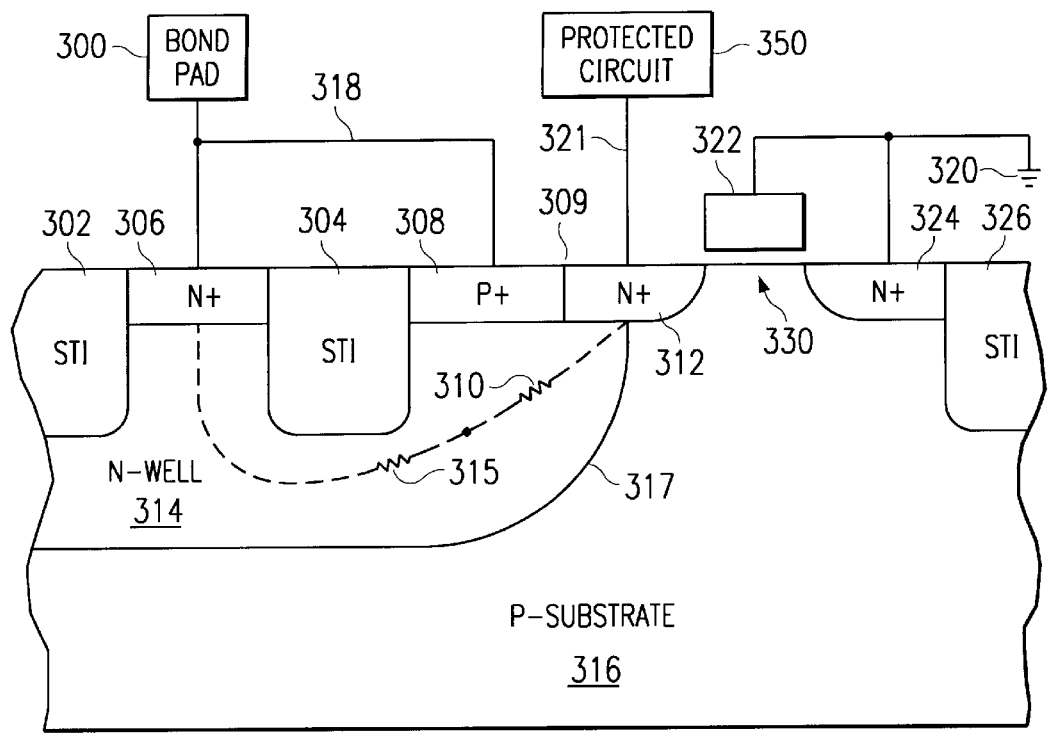
FIG. 3A is a section diagram of a protection circuit of the present invention using shallow trench isolation.

Referring now to FIG. 3A, there is a section diagram of a protection circuit of the present invention using shallow trench isolation (STI). The circuit is connected to an external terminal or bond pad 300 via lead 318. The circuit is formed at a face of lightly doped P-substrate 316. A lightly doped N-well region 314 is formed at the face of the P-substrate and extends into the substrate to a junction depth of preferably about 1.8 micrometers. A heavily doped N+ region 306 electrically connects lead 318 to N-well region 314. A heavily doped P+ region 308 is formed within N-well region 314 and extends to a junction depth of preferably about 0.2 micrometer. The P+ region 308 is separated from the N+ region 306 by STI region 304, which extends from the face to a depth of preferably about 1.0 micrometer. A heavily doped N+ region 312 abuts the P+ region 308 and extends across the N-well and P-substrate junction 317 into the P-substrate region 316. This N+ region extends to a junction depth of preferably about 0.2 micrometer. A protected circuit is preferably connected to the N+ region 312 via lead 321.

Figure 3B:
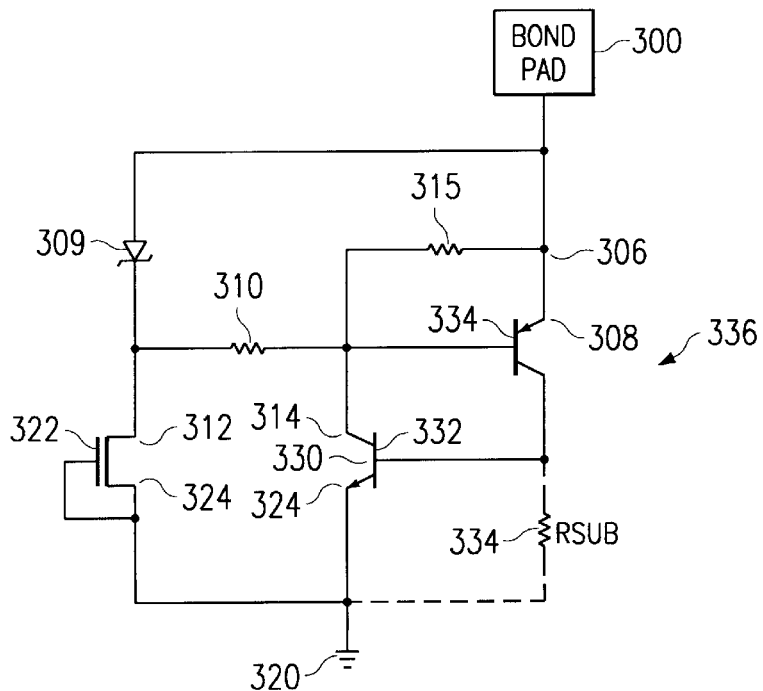
FIG. 3B is a schematic diagram of the protection circuit of FIG. 3A.

Operation of the protection circuit of FIG. 3A will be explained in detail with reference to the corresponding schematic diagram of FIG. 3B. The protection circuit includes an SCR 336 as a primary protection device. The SCR further includes PNP transistor 334 and NPN transistor 332. The protection circuit also includes a secondary protection circuit formed by parasitic N-well resistors 315 and 310 connected in series with MOS transistor 322. N-well resistor 315 is connected between N+ region 306 and the N-well region below P+ region 308. N-well resistor 310 is connected between the N-well region below P+ region 308 and the N+ region 312. The purpose of the SCR is to discharge most of the electrostatic discharge (ESD) current applied to bond pad 300. The purpose of the secondary protection circuit is to limit the maximum voltage at protected circuit 350 connected to N+ region 312.

In operation, the secondary protection circuit is activated by application of a positive electrostatic discharge pulse at the bond pad or external terminal 300 with respect to the Vss reference supply terminal 320 This positive pulse initially induces avalanche conduction of the MOS transistor due to a high electric field between the drain region 312 and the gate region 322. This avalanche conduction injects positive current directly into the base region 330 of the NPN transistor 332, thereby initiating NPN conduction. The positive current also develops a voltage drop across N-well resistors 315 and 310 that serves to forward bias zener diode 309. This forward bias of zener diode 309 also develops a forward bias across the parallel base-emitter junction of PNP transistor 334. The PNP transistor base current initiates PNP transistor conduction and consequent regenerative conduction in SCR 336.

Figure 1A:
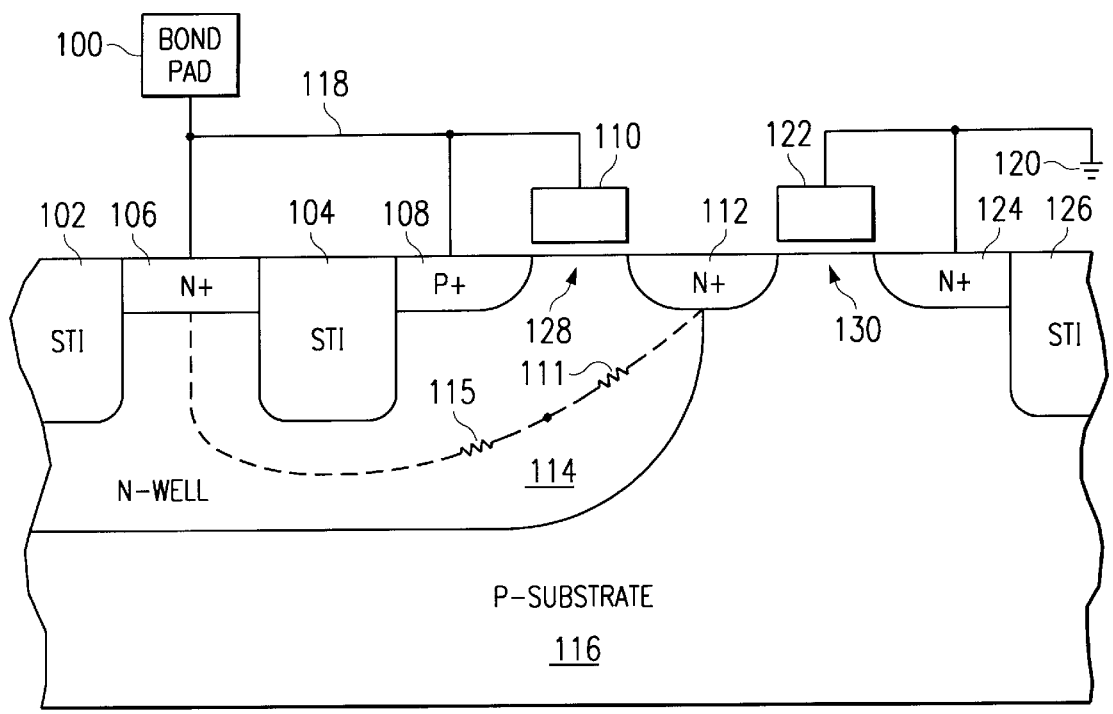
FIG. 1A is a section diagram of a protection circuit of the prior art using shallow trench Elation.
Figure 1B:
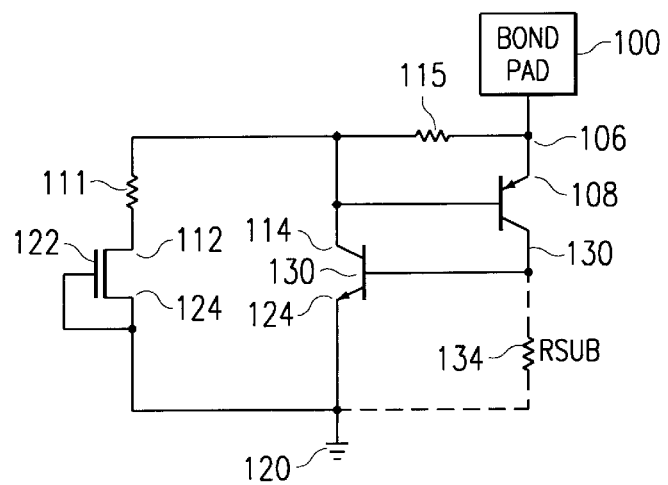
FIG. 1B is a schematic diagram of the protection circuit of FIG. 1A.
Figure 2A:
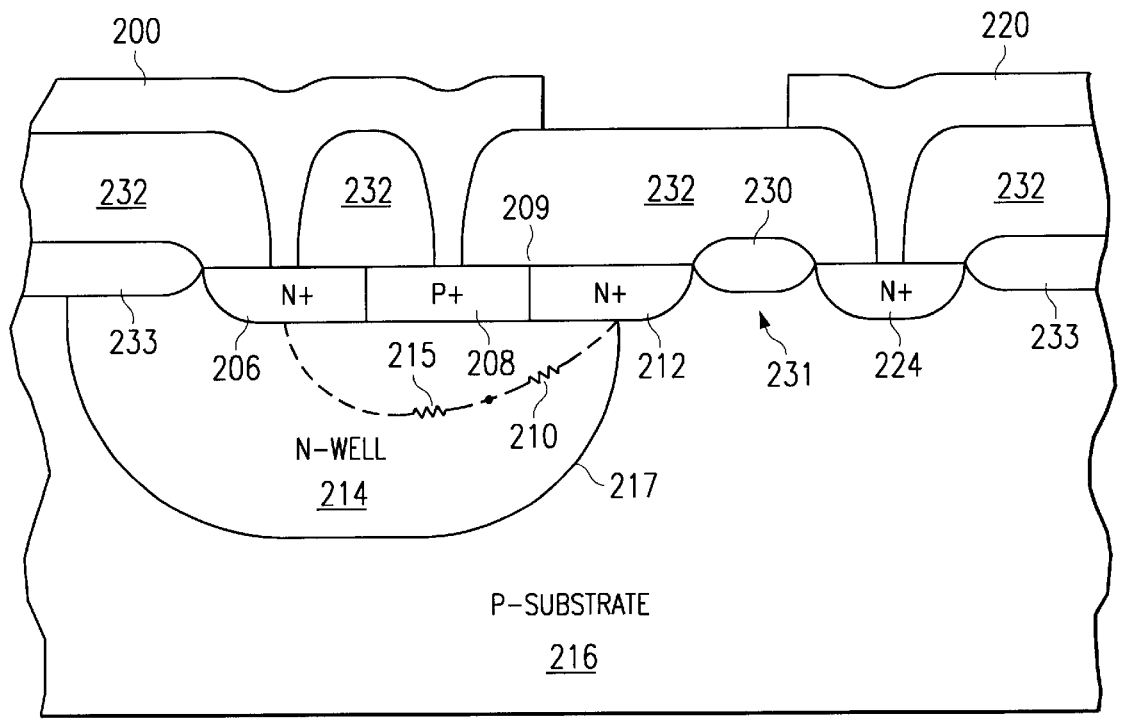
FIG. 2A is a section diagram of a protection circuit of the prior art using local oxidation of silicon (LOCOS) isolation.
Figure 2B:
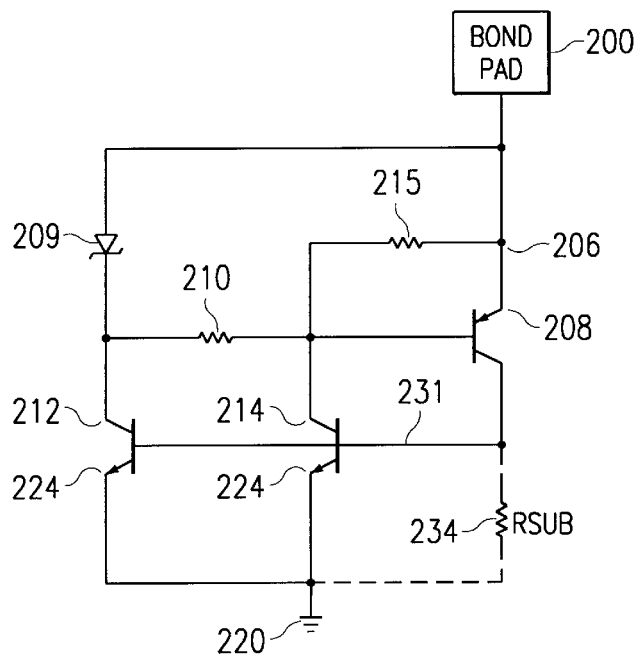
FIG. 2B is a schematic diagram of the protection circuit of FIG. 2A.

This circuit is highly advantageous in maintaining a low activation voltage of the SCR 336. N-well resistor 315, which shunts the base-emitter junction of PNP transistor 334 during normal circuit operation, increases in value during an ESD event due to a relatively large depletion width of junction 317 under reverse bias. This increased depletion width limits current flow from N+ region 306 under STI region 304. The activation voltage and forward bias of the PNP transistor 334, therefore, is primarily determined by the avalanche threshold of MOS transistor 322. A further advantage of the present invention results from elimination of thin oxide regions in the SCR 336. Once the SCR is activated, collector-emitter voltage across the NPN transistor 332 is typically much less than the avalanche conduction threshold of MOS transistor 322. The electric field between N+ region 312 and gate region 322, therefore, is greatly reduced. Since there is no corresponding thin oxide region as between gate 110 and N+ region 112 (FIG. 1A) to develop a high electric field, reliability of the protection circuit of FIG. 3A is greatly improved.

Figure 4:
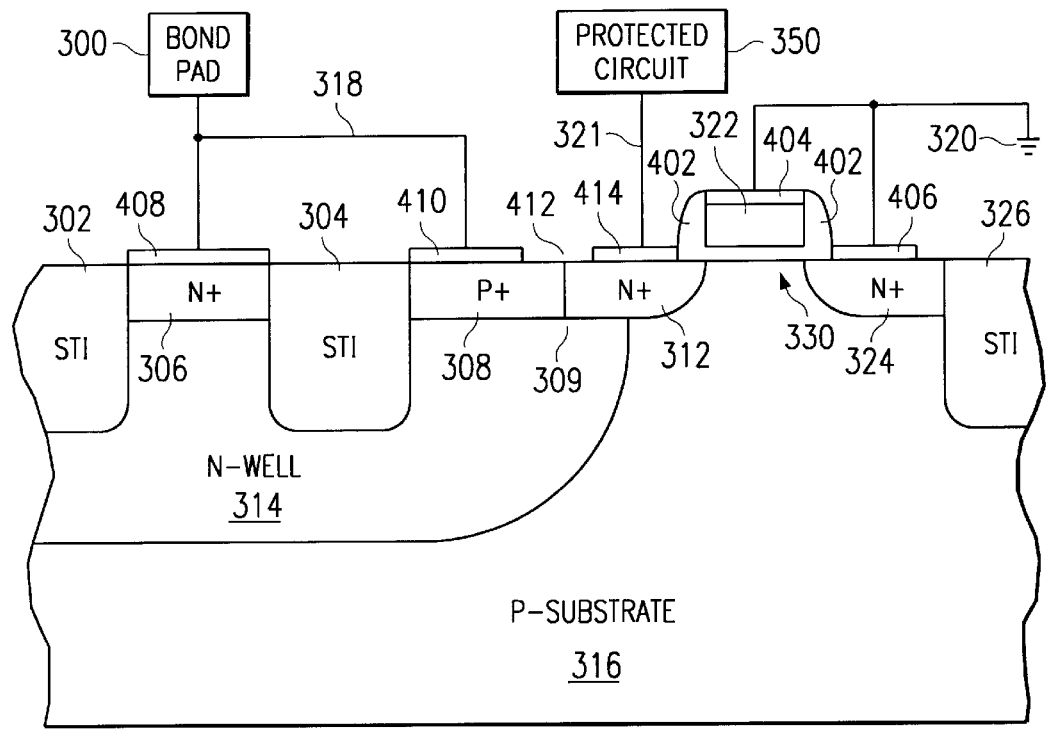
FIG. 4 is a section diagram of another embodiment of a protection circuit of the present invention using shallow trench isolation and metal clad heavily doped regions showing connection of a protected circuit.

Turning now to FIG. 4, there is a second embodiment of a protection circuit of the present invention using shallow trench isolation (STI) and metal clad heavily doped regions. This embodiment is the same as the protection circuit of FIG. 3A except that metal silicide layers 408, 20 410, 414 and 406 are formed at the face of the substrate on exposed silicon surfaces and metal silicide layer 404 is formed on the exposed surface of gate region 322. These silicides may be formed with titanium, tungsten, platinum or other metals to reduce parasitic circuit resistance and improve circuit speed as is well known in the art. Prior to metal formation, however, region 412 is masked with a thin oxide region or other suitable mask overlying zener diode junction 309. A subsequent metal formation and anneal step, therefore, forms metal silicide except at region 412, gate sidewall spacers 402, and STI regions. This opening 412 in the metal silicide film between region 410 and 414 is highly advantageous in preserving proper circuit operation. The MOS transistor determines the activation threshold as previously described. The opening 412, however, eliminates a low resistance metal silicide current path in series with the MOS transistor between bond pad 300 and Vss terminal 320. Elimination of this low resistance path avoids shunting the SCR with the MOS transistor and, therefore, avoids premature failure of the MOS transistor.

Figure 5:
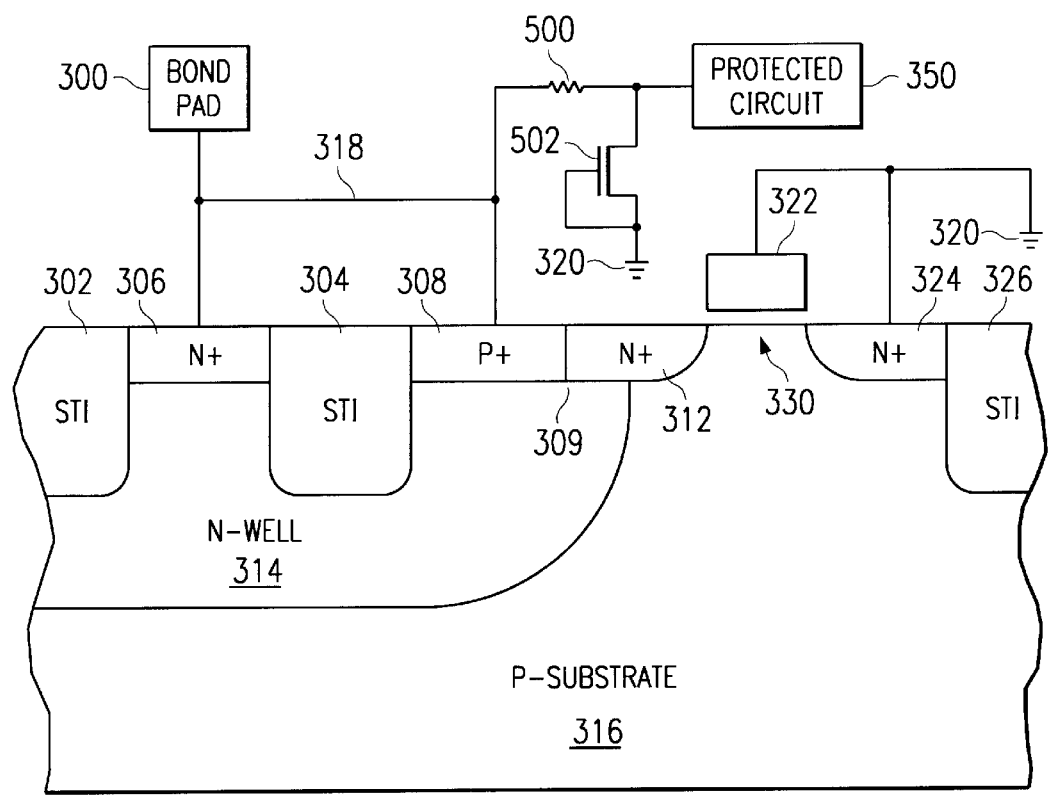
FIG. 5 is a section diagram of the embodiment of FIG. 3A showing connection of a protected circuit by means of an isolation stage.

Referring now to FIG. 5, there is a section diagram of the embodiment of FIG. 3A showing connection of a protected circuit by means of a secondary protection circuit or isolation stage. In this embodiment, protected circuit 350 is connected to lead 318 via resistor 500. This resistor 500 may be formed from any suitable material including N-well, N+ or P+ doped regions or polycrystalline silicon and is preferably at least 80Ω. A separate MOS transistor 502 is connected to the low voltage side of resistor 500 to clamp the maximum voltage at the protected circuit 350 during an ESD event. This MOS transistor preferably has a width of at least 40 micrometers. This embodiment is highly advantageous in providing an independent secondary protection circuit formed by resistor 500 and MOS transistor 502. The size parameters of this independent secondary protection circuit may be adjusted independently of the SCR values of FIG. 3A.

Although the invention has been described in detail with reference to its preferred embodiments, it is to be understood that this description is by way of example only and is not to be construed in a limiting sense. For example, various combinations of resistors and transistors of the previous embodiments may be combined to provide the advantages of the present invention as will be appreciated by one of ordinary skill in the art having access to the instant specification. Moreover, the STI may generally be used to inhibit silicide formation in other ESD protection structures such as PN diodes, MOS transistors, and N-well resistors. Furthermore, the inventive concept of the present invention may be advantageously extended to many parallel transistors in a semiconductor body without current hogging.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A structure, comprising:
   a lightly doped substrate having a first conductivity type and having a face;
   a first lightly doped region having a second conductivity type formed within the lightly doped substrate;
   a first heavily doped region having the first conductivity type formed at the face and extending to a first depth within the first lightly doped region;
   a second heavily doped region having the second conductivity type formed at the face abutting the first heavily doped region and extending to a second depth at a junction of the lightly doped substrate and the first lightly doped region;
   a fourth heavily doped region having the second conductivity type formed at the face within the lightly doped substrate and spaced apart from the first heavily doped region and on a side of the first heavily doped region opposite the second heavily doped region, the fourth heavily doped region being electrically connected to the first heavily doped region; and
   a first isolation region formed at the face, abutting at least one of the first and second heavily doped regions and extending to a third depth greater than either of the first and the second depths.

2. A structure as in claim 1, further comprising a third heavily doped region having the second conductivity type formed at the face within the lightly doped substrate and spaced apart from the second heavily doped region.

3. A structure as in claim 2, further comprising a gate region insulatively disposed adjacent the lightly doped substrate between the second and third heavily doped regions, the gate region electrically connected to a reference terminal.

4. A structure as in claim 2, further comprising a second isolation region formed at the face, abutting third heavily doped region and extending to the third depth.

5. A structure as in claim 1, further comprising a protected circuit electrically connected to the second heavily doped region.

6. A structure as in claim 1, further comprising:
   an isolation circuit connected to the external terminal; and
   a protected circuit electrically connected to the isolation circuit.

7. A structure as in claim 6, wherein the isolation circuit further comprises a resistor connected between the external terminal and protected circuit and a diode having an end connected between the resistor and the protected circuit.

8. A structure as in claim 6, wherein the protected circuit comprises a digital processing circuit.

9. A structure as in claim 6, wherein the protected circuit comprises a dynamic random access memory circuit.

10. A structure as in claim 1, wherein the second heavily doped region abutting the first heavily doped region comprises a junction diode.

11. A structure as in claim 10, wherein the junction diode is a zener diode.

12. A structure as in claim 10, wherein the junction diode is a zener diode.

13. A structure, comprising:
- a lightly doped substrate having a first conductivity type and having a face;
- a first lightly doped region having a second conductivity type formed within the lightly doped substrate;
- a first heavily doped region having the first conductivity type formed at the face and extending to a first depth within the first lightly doped region;
- a second heavily doped region having the second conductivity type formed at the face abutting the first heavily doped region and at a junction of the lightly doped substrate and the first lightly doped region;
- a fourth heavily doped region having the second conductivity type formed at the face within the lightly doped substrate and spaced apart from the first heavily doped region and on a side of the first heavily doped region opposite the second heavily doped region; and
- a first isolation region formed at the face, abutting at least one of the first and second heavily doped regions and extending to a second depth greater than the first depth.

14. A structure as in claim 13, further comprising a third heavily doped region having the second conductivity type formed at the face within the lightly doped substrate and spaced apart from the second heavily doped region.

15. A structure as in claim 14, further comprising a gate region insulatively disposed adjacent the lightly doped substrate between the second and third heavily doped regions, the gate region electrically connected to a reference terminal.

16. A structure as in claim 14, further comprising a second isolation region formed at the face, abutting third heavily doped region and ending to the second depth.

17. A structure as in claim 13, further comprising:
- an isolation circuit connected to the external terminal; and
- a protected circuit electrically connected to the isolation circuit.

18. A structure as in claim 17, wherein the isolation circuit further comprises a resistor connected between the external terminal and protected circuit and a diode having an end connected between the resistor and the protected circuit.

19. A structure as in claim 17, wherein the protected circuit comprises a digital processing circuit.

20. A structure as in claim 17, wherein the protected circuit comprises a dynamic random access memory circuit.

21. A structure as in claim 13, wherein the second heavily doped region abutting the first heavily doped region comprises a junction diode.

* * * * *